(12) United States Patent
    Kim et al.

(10) Patent No.: US 12,677,495 B2
(45) Date of Patent: Jul. 7, 2026

(54) IMAGE SENSORS

(71) Applicant: Samsung Electronics Co., Ltd.,
               Suwon-si (KR)

(72) Inventors: Jeonglim Kim, Suwon-si (KR);
               Byungje Jung, Suwon-si (KR)

(73) Assignee: Samsung Electronics Co., Ltd.,
               Gyeonggi-do (KR)

( * ) Notice: Subject to any disclaimer, the term of this
             patent is extended or adjusted under 35
             U.S.C. 154(b) by 392 days.

(21) Appl. No.: 18/479,249

(22) Filed: Oct. 2, 2023

(65) Prior Publication Data

US 2024/0234467 A1     Jul. 11, 2024

(30) Foreign Application Priority Data

Jan. 6, 2023     (KR) ........................ 10-2023-0002515

(51) Int. Cl.
     H10F 39/00 (2025.01)
(52) U.S. Cl.
     CPC ......... H10F 39/807 (2025.01); H10F 39/802
                                              (2025.01)
(58) Field of Classification Search
     CPC .... H10F 39/807; H10F 39/802; H10F 39/199;
              H10F 39/8053; H10F 39/80373; H10F
              39/8063; H10F 39/813; H10F 39/8023;
              H10F 39/8037; H10F 39/811
     See application file for complete search history.

(56) References Cited

U.S. PATENT DOCUMENTS

| 9,117,711 | B2 | 8/2015 | Suzuki et al. | |
| 9,386,206 | B2 | 7/2016 | Tanaka | |
| 9,608,024 | B2 | 3/2017 | Lee et al. | |
| 9,793,310 | B2 | 10/2017 | Ihara et al. | |
| 10,192,910 | B2 | 1/2019 | Ihara | |
| 11,018,173 | B2 | 5/2021 | Kim et al. | |
| 11,329,089 | B1 | 5/2022 | Ma | |
| 2023/0299106 | A1* | 9/2023 | Kung | H10F 39/199 |
| 2023/0411423 | A1* | 12/2023 | Jin | H10F 39/8037 |
| 2024/0038809 | A1* | 2/2024 | Kim | H10F 39/802 |

(Continued)

FOREIGN PATENT DOCUMENTS

| CN | 110634899 A | 12/2019 |
| CN | 111834384 A | 10/2020 |

(Continued)

*Primary Examiner* — J. E. Schoenholtz
(74) *Attorney, Agent, or Firm* — Harness, Dickey &
Pierce, P.L.C.

(57) ABSTRACT

An image sensor includes a substrate including a plurality of
pixels and a photoelectric conversion region in an inside
thereof, a pixel isolation structure isolating the plurality of
pixels, and an isolation layer defining a plurality of active
regions in the substrate, wherein the plurality of active
regions include a center part having a plurality of branching
sections extending from a center toward the plurality of
pixels, the center being adjacent to each of the plurality of
pixels, and an extension part in the plurality of pixels and
extending in a horizontal direction from the center part. In
a plan view, a first angle between a side wall of the extension
part and the pixel isolation structure extending in a first
direction exceeds about 45 degrees, or a second angle
between two adjacent branching sections among the plural-
ity of branching sections is less than about 90 degrees.

20 Claims, 11 Drawing Sheets

(56) References Cited

U.S. PATENT DOCUMENTS

2025/0126907 A1* 4/2025 Takahashi ......... H10F 39/80373
2025/0133847 A1* 4/2025 Nishida ............ H10F 39/80373

FOREIGN PATENT DOCUMENTS

| CN | 113848678 A | 12/2021 |
| KR | 100511680 B1 | 8/2005 |
| KR | 10-2018-0077710 A | 7/2018 |
| KR | 10-2022-0099140 A | 7/2022 |

* cited by examiner

A1-A1'

| AJ | BJ | CJ | DJ | EJ | FJ | GJ | HJ | IJ | JJ |
|----|----|----|----|----|----|----|----|----|----|
| AI | BI | CI | DI | EI | FI | GI | HI | II | JI |
| AH | BH | CH | DH | EH | FH | GH | HH | IH | JH |
| AG | BG | CG | DG | EG | FG | GG | HG | IG | JG |
| AF | BF | CF | DF | EF | FF | GF | HF | IF | JF |
| AE | BE | CE | DE | EE | FE | GE | HE | IE | JE |
| AD | BD | CD | DD | ED | FD | GD | HD | ID | JD |
| AC | BC | CC | DC | EC | FC | GC | HC | IC | JC |
| AB | BB | CB | DB | EB | FB | GB | HB | IB | JB |
| AA | BA | CA | DA | EA | FA | GA | HA | IA | JA |

FIG. 8

| A'J" | B'J" | C'J" | D'J" | E'J" | F'J" | G'J" | H'J" | I'J" | J'J" |
|------|------|------|------|------|------|------|------|------|------|
| A'I" | B'I" | C'I" | D'I" | E'I" | F'I" | G'I" | H'I" | I'I" | J'I" |
| A'H" | B'H" | C'H" | D'H" | E'H" | F'H" | G'H" | H'H" | I'H' | J'H' |
| A'G" | B'G" | C'G" | D'G" | E'G" | F'G" | G'G" | H'G" | I'G" | J'G" |
| A'F" | B'F" | C'F" | D'F" | E'F" | F'F" | G'F" | H'F" | I'F" | J'F" |
| A'E" | B'E" | C'E" | D'E" | E'E" | F'E" | G'E" | H'E" | I'E" | J'E" |
| A'D" | B'D" | C'D" | D'D" | E'D" | F'D" | G'D" | H'D" | I'D" | J'D" |
| A'C" | B'C" | C'C" | D'C" | E'C" | F'C" | G'C" | H'C" | I'C" | J'C" |
| A'B" | B'B" | C'B" | D'B" | E'B" | F'B" | G'B" | H'B" | I'B" | J'B" |
| A'A" | B'A" | C'A" | D'A" | E'A" | F'A" | G'A" | H'A" | I'A" | J'A" |

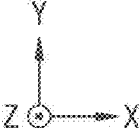

IMAGE SENSORS

CROSS-REFERENCE TO RELATED APPLICATION

This application is based on and claims priority under 35 U.S.C. § 119 to Korean Patent Application No. 10-2023-0002515, filed on Jan. 6, 2023, in the Korean Intellectual Property Office, the disclosure of which is incorporated by reference herein in its entirety.

BACKGROUND

The inventive concepts relate to image sensors, and more particularly, to image sensors including a vertical gate structure.

Image sensors are devices that convert an optical image signal into an electrical signal. Image sensors include a plurality of pixels. Each pixel includes a photodiode region, which receives and converts incident light into an electrical signal, and a pixel circuit, which outputs a pixel signal by using charge generated in the photodiode region. With the increase in the integration density of image sensors, the size of a pixel decreases and the sizes of elements of a pixel circuit also decrease.

SUMMARY

Some example embodiments of the inventive concepts provide image sensors configured to obtain a high-definition image even when the size of a pixel decreases.

According to some example embodiments of the inventive concepts, an image sensor may include a substrate including a plurality of pixels, each pixel of the plurality of pixels including a separate photoelectric conversion region in an interior of the substrate, a pixel isolation structure isolating the plurality of pixels, and an isolation layer defining a plurality of active regions in the substrate. The plurality of active regions may include a center part having a plurality of branching sections extending from a center toward the plurality of pixels, the center being adjacent to each of the plurality of pixels, and an extension part in the plurality of pixels and extending in a horizontal direction from the center part. In a plan view, a first angle between a side wall of the extension part and the pixel isolation structure extending in a first direction may exceed about 45 degrees, or a second angle between two adjacent branching sections among the plurality of branching sections may be less than about 90 degrees.

According to some example embodiments of the inventive concepts, an image sensor may include a substrate including a plurality of pixels, a first surface, and a second surface opposite to the first surface, each pixel of the plurality of pixels including a separate photoelectric conversion region in an interior of the substrate, an interlayer insulating layer on the first surface of the substrate, a wiring structure on the interlayer insulating layer, a pixel isolation structure isolating the plurality of pixels, an isolation layer defining a plurality of active regions in the substrate, and a plurality of transfer gates on the first surface of the substrate, the plurality of transfer gates passing through the interlayer insulating layer and at least a portion of the substrate in a vertical direction, wherein each pixel of the plurality of pixels has a corner extending in a first horizontal direction and a second horizontal direction that is perpendicular to the first horizontal direction. In a plan view, a first angle between a first edge of each of the plurality of transfer gates respectively overlapping with the plurality of active regions in the vertical direction and the pixel isolation structure extending in the first horizontal direction may exceed about 45 degrees, or a second angle between a plurality of second edges of each of the plurality of transfer gates separated from the plurality of active regions in a horizontal direction may be greater than or equal to 90 degrees.

According to some example embodiments of the inventive concepts, an image sensor may include a substrate including a plurality of pixels, a first surface, and a second surface opposite to the first surface, each pixel of the plurality of pixels including a separate photoelectric conversion region in an interior of the substrate, an interlayer insulating layer on the first surface of the substrate, a wiring structure on the interlayer insulating layer, a pixel isolation structure isolating the plurality of pixels, an isolation layer defining a plurality of active regions in the substrate, and a plurality of transfer gates on the first surface of the substrate, the plurality of transfer gates passing through the interlayer insulating layer and at least a portion of the substrate in a vertical direction, wherein the plurality of active regions include a center part having a plurality of branching sections extending from a center toward the plurality of pixels, the center being adjacent to each of the plurality of pixels, and an extension part in the plurality of pixels and extending in a horizontal direction from the center part. In a plan view, a first angle between a side wall of the extension part and the pixel isolation structure extending in a first direction may exceed about 45 degrees, a second angle between two adjacent branching sections among the plurality of branching sections may be less than about 90 degrees, a third angle between a first edge of each of the plurality of transfer gates respectively overlapping with the plurality of active regions in the vertical direction and the pixel isolation structure extending in the first direction may exceed about 45 degrees, and a fourth angle between a plurality of second edges of each of the plurality of transfer gates separated from the plurality of active regions in the horizontal direction may be greater than or equal to about 90 degrees.

BRIEF DESCRIPTION OF THE DRAWINGS

Example embodiments will be more clearly understood from the following detailed description taken in conjunction with the accompanying drawings in which:

FIG. 8 is a diagram of an example of an arrangement of transfer gates, according to some example embodiments;

DETAILED DESCRIPTION

Figure 1:
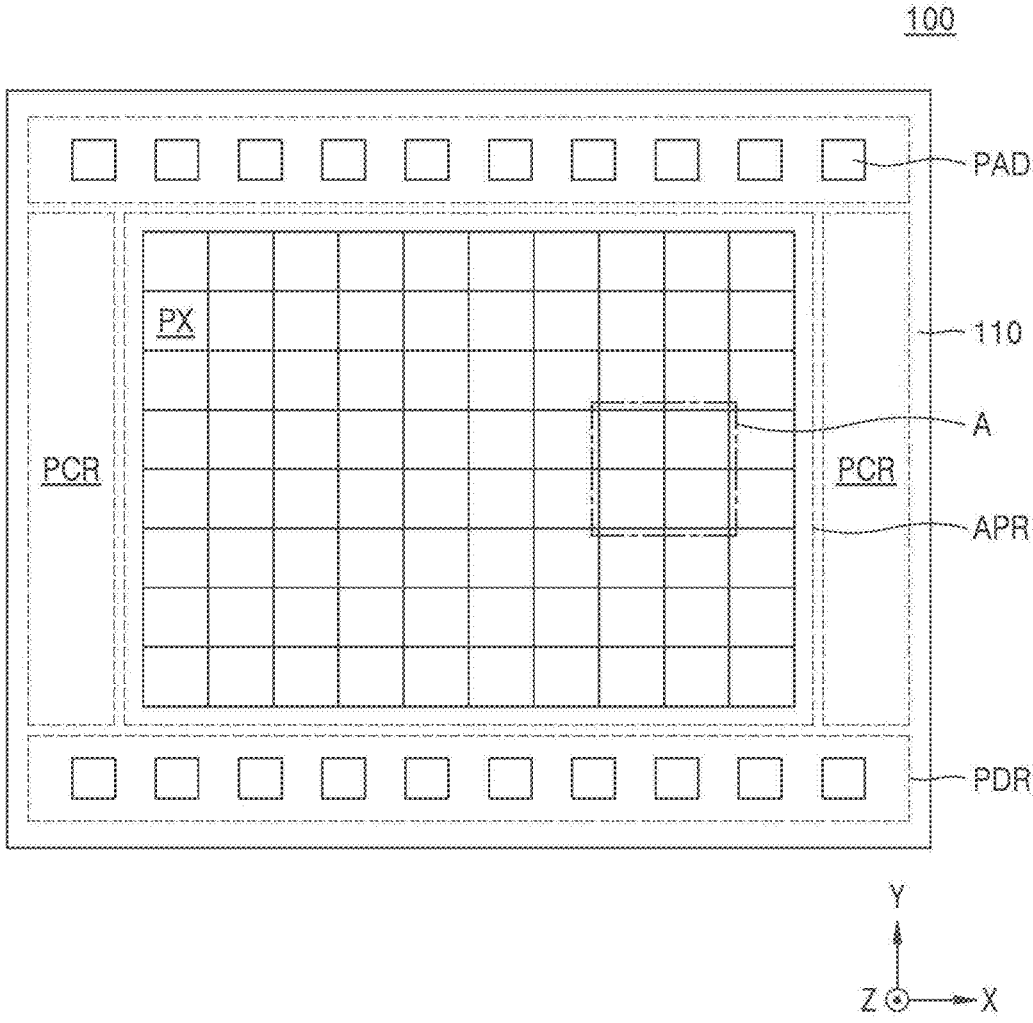
FIG. 1 is a layout diagram of an image sensor according to some example embodiments.

Hereinafter, some example embodiments are described in detail with reference to the accompanying drawings. In the drawing, like reference characters denote like elements, and redundant descriptions thereof will be omitted.

Further, in the drawings, the size and thickness of each element are arbitrarily illustrated for ease of description, and the present inventive concepts are not necessarily limited to those illustrated in the drawings.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel." "coplanar." or the like with regard to other elements and/or properties thereof (e.g., structures, surfaces, directions, or the like) may be "perpendicular." "parallel," "coplanar," or the like or may be "substantially perpendicular," "substantially parallel." "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially." it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Figure 2:
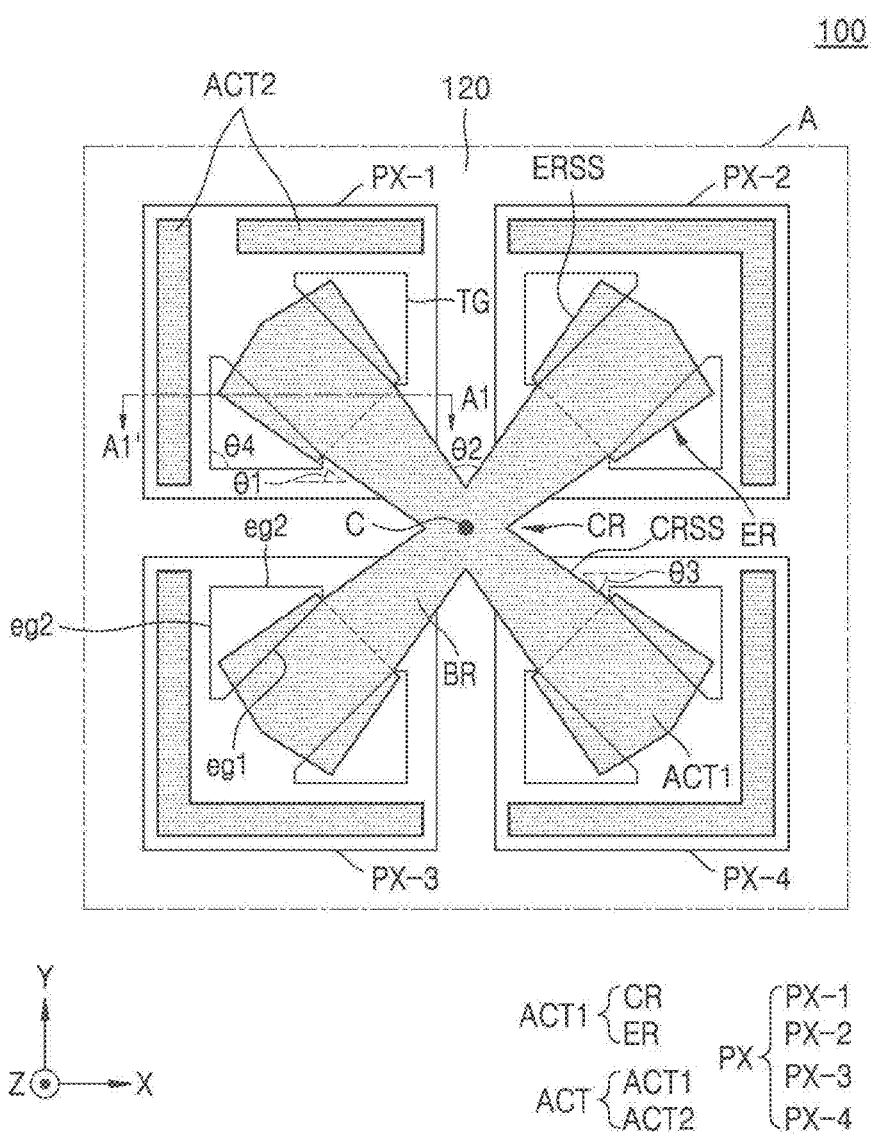
FIG. 2 illustrates an enlarged layout of a region A in FIG. 1, according to some example embodiments.
Figure 3:
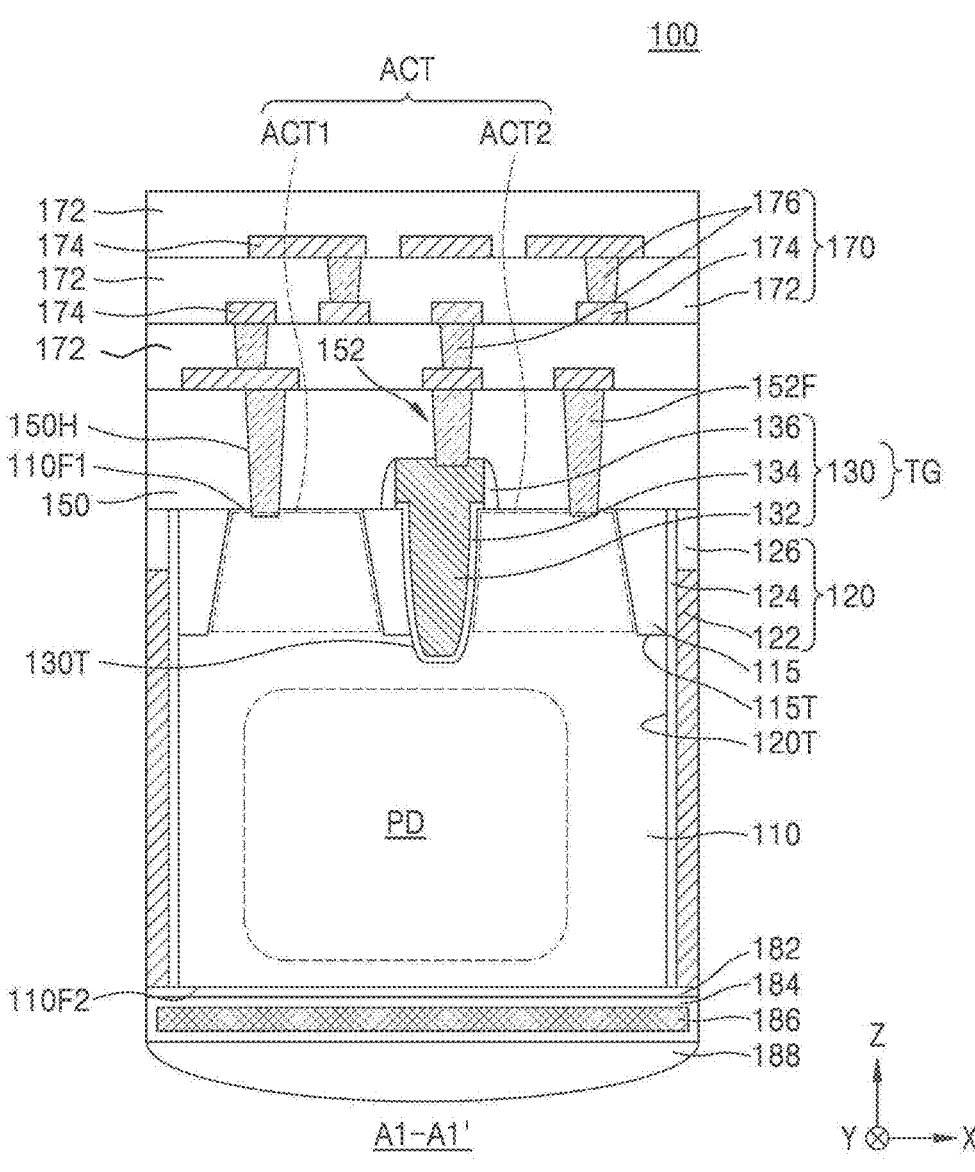
FIG. 3 is a cross-sectional view taken along line A1-A1' in FIG. 2, according to some example embodiments.

FIG. 1 is a layout diagram of an image sensor according to some example embodiments. FIG. 2 illustrates an enlarged layout of a region A in FIG. 1, according to some example embodiments. FIG. 3 is a cross-sectional view taken along line A1-A1' in FIG. 2, according to some example embodiments.

Referring to FIGS. 1 to 3, an image sensor 100 may include an active pixel region APR, a peripheral circuit region PCR, and a pad region PDR in a semiconductor substrate 110.

The active pixel region APR may be in a central portion of the semiconductor substrate 110, and the peripheral circuit region PCR may be at each of opposite sides of the active pixel region APR. The pad region PDR may be in an edge portion of the semiconductor substrate 110.

The active pixel region APR may include a plurality of pixels PX. A plurality of photoelectric conversion regions PD may be respectively in the pixels PX, for example such that each pixel PX may include at least one separate photoelectric conversion region PD in an interior of the semiconductor substrate 110. In the active pixel region APR, the pixels PX may be arranged in a matrix of columns and rows in a first horizontal direction (the X direction) that is parallel with the top surface of the semiconductor substrate 110 and in a second horizontal direction (the Y direction) that is perpendicular to the first horizontal direction (the X direction) and parallel with the top surface of the semiconductor substrate 110. Some of the pixels PX may include an optical black pixel (not shown). The optical black pixel may function as a reference pixel with respect to the active pixel region APR and perform a function of automatically correcting a dark signal.

Although it is illustrated that the peripheral circuit region PCR is at each of the opposite sides of the active pixel region APR in a plan view, example embodiments are not limited thereto. The peripheral circuit region PCR may be arranged to entirely surround the active pixel region APR. A conductive pad PAD may be in the pad region PDR. The conductive pad PAD may be in an edge portion of the semiconductor substrate 110.

The semiconductor substrate 110 may include a first surface 110F1 and a second surface 110F2 opposite to the first surface 110F1. Here, for convenience of description, a surface of the semiconductor substrate 110, in which a color filter 186 is arranged, is referred to as the second surface 110F2, and a surface of the semiconductor substrate 110, which is opposite to the second surface 110F2, is referred to as the first surface 110F1.

In some example embodiments, the semiconductor substrate 110 may include a P-type semiconductor substrate. For example, the semiconductor substrate 110 may include a P-type silicon substrate. In some example embodiments, the semiconductor substrate 110 may include a P-type bulk substrate and a P-type or N-type epitaxial layer grown thereon. In some example embodiments, the semiconductor substrate 110 may include an N-type bulk substrate and a P-type or N-type epitaxial layer grown thereon. In some example embodiments, the semiconductor substrate 110 may include an organic plastic substrate.

In the active pixel region APR, the pixels PX may be arranged in a matrix in the semiconductor substrate 110 (e.g., in an interior of the semiconductor substrate 110 between the first and second surfaces 110F1 and 110F2). The photoelectric conversion regions PD may be respectively in the pixels PX. Each of the photoelectric conversion regions PD may be doped with N-type impurities. For example, a photoelectric conversion region PD may have a potential gradient due to the difference in impurity concentration between an upper portion and a lower portion thereof. In some example embodiments, the photoelectric conversion region PD may be formed by vertically stacking a plurality of impurity regions. A P-well region (not shown) may be in a portion adjacent to the first surface 110F1 of the semiconductor substrate 110. The P-well region may be adjacent to the photoelectric conversion region PD and doped with P-type impurities.

An isolation layer 115 defining an active region ACT may be on the first surface 110F1 of the semiconductor substrate 110. The isolation layer 115 may be in an isolation trench 115T, which is formed to a certain depth from the first surface 110F1 of the semiconductor substrate 110. The isolation layer 115 may include silicon oxide, silicon nitride, silicon oxynitride, or a combination thereof.

Here, a plurality of active regions ACT may include a first active region ACT1 and a second active region ACT2. A transfer gate TG and a floating diffusion region FD (in FIG. 4) may be in the first active region ACT1.

In a plan view, the first active region ACT1 may extend from the center C adjacent to a plurality of pixels PX. In at least one pixel PX selected from the pixels PX, the second active region ACT2 may be separated from (e.g., isolated from direct contact with) the first active region ACT1 in a horizontal direction (the X direction and/or the Y direction). The first active region ACT1 may have a different shape (e.g., a different planar shape) than the second active region ACT2. Referring to FIG. 2, the second active region ACT2 may have a bar shape and/or an L shape but is not limited thereto.

The first active region ACT1 may include a center part CR, which includes a plurality of branching sections BR respectively extending toward a plurality of pixels PX from the center C adjacent to the pixels PX, and an extension part ER, which is in the pixels PX and extends in the horizontal direction (the X direction and/or the Y direction) from the center part CR. As shown, the extension part ER may include a plurality of separate extension parts ER that are each in a separate pixel of the plurality of pixels PX and each extend from a separate branching section BR of the plurality of branching sections BR into the separate pixel PX and away from the center C. For example, the center part CR may have four branching sections BR respectively extending toward different pixels PX. For example, the extension direction of each branching section BR of the center part CR may be different from the extension direction of a side wall ERSS of the extension part ER. In other words, the extension direction of a side wall CRSS of the center part CR may be different from the extension direction of the side wall ERSS of the extension part ER. In some example embodiments, the extension direction of the side wall CRSS of the center part CR may be the same as the extension direction of the side wall ERSS of the extension part ER. The center part CR and the extension part ER are only formally distinguished from each other for explanation. The center part CR and the extension part ER may include the same material as each other and may be integrally combined. For example, the center part CR, including the branching sections BR, and the extension part ER may be separate portions of a single, unitary piece of material. In FIG. 2, the boundary between the branching sections BR and the extension part ER in the first active region ACT1 is demarcated by a dashed line, but it will be understood that there may not be any physical interface between separate physical structures at the dashed line boundary, where the branching sections BR and the extension part ER in the first active region ACT1 may be separate portions of a single, unitary piece of material that extends continuously across the dashed-line boundary between the branching sections BR and the extension part ER to constitute both the branching sections BR and the extension part as a unitary, single piece of material.

A first angle $\theta_1$ between the side wall ERSS of the extension part ER and a pixel isolation structure 120 extending in the first horizontal direction (the X direction) may be greater than about 45 degrees and less than or equal to about 90 degrees. In some example embodiments, the first angle $\theta_1$ may exceed (e.g., may be greater than) about 45 degrees (e.g., between about 45 degrees and about 120 degrees, etc.). A second angle $\theta_2$ between two adjacent branching sections BR of the center part CR may be greater than or equal to about 45 degrees and less than about 90 degrees. In some example embodiments, the second angle $\theta_2$ may be less than about 90 degrees (e.g., between 0 degrees and about 90 degrees, between about 30 degrees and about 90 degrees, etc.). To meet the above ranges of the first angle $\theta_1$ and the second angle $\theta_2$, the location and shape of the isolation layer 115 may vary. For example, the angle between two adjacent branching sections BR having the center part CR in common may be constant.

In the active pixel region APR, the pixel isolation structure 120 may be arranged in the semiconductor substrate 110, and a plurality of pixels PX may be defined by the pixel isolation structure 120. The pixel isolation structure 120 may be between two adjacent photoelectric conversion regions PD. Two adjacent photoelectric conversion regions PD may be physically and electrically separated by the pixel isolation structure 120. The pixel isolation structure 120 may be among a plurality of photoelectric conversion regions PD arranged in a matrix and may have a grid or mesh shape in a plan view.

The pixel isolation structure 120 may be in a pixel trench 120T which passes through the semiconductor substrate 110 from the first surface 110F1 to the second surface 110F2 of the semiconductor substrate 110. The pixel isolation structure 120 may include a conductive layer 122, an insulating liner 124, and an upper insulating layer 126.

The insulating liner 124 may be on an inner wall of the pixel trench 120T and may extend from the first surface 110F1 to the second surface 110F2 of the semiconductor substrate 110 The conductive layer 122 may be surrounded by the insulating liner 124 and fill the pixel trench 120T. The upper insulating layer 126 may be in a portion of the pixel trench 120T, which is adjacent to the first surface 110F1 of the semiconductor substrate 110. The upper insulating layer 126 may be on the top surface of the conductive layer 122 and fill the entrance of the pixel trench 120T.

In some example embodiments, the conductive layer 122 may include at least one selected from the group consisting of doped polysilicon, metal, metal silicide, metal nitride, and a metal-containing layer. In some example embodiments, the insulating liner 124 may include metal oxide, such as hafnium oxide, aluminum oxide, or tantalum oxide. In this case, the insulating liner 124 may function as a negative fixed charge layer, but the inventive concepts are not limited thereto. In some example embodiments, the insulating liner 124 may include an insulating material, such as silicon oxide, silicon nitride, or silicon oxynitride. The upper insulating layer 126 may include an insulating material, such as silicon oxide, silicon nitride, or silicon oxynitride.

Transistors forming a pixel circuit may be on the active region ACT. For example, the active region ACT may be a portion of the semiconductor substrate 110, on which the transfer gate TG, a select gate SG (in FIG. 4), and a reset gate RG (in FIG. 4) are arranged. The floating diffusion region FD (in FIG. 4) may be arranged in a portion of the active region ACT, e.g., in a portion of the active region ACT adjacent to the transfer gate TG. For example, the floating diffusion region FD may be in a portion of the first active region ACT1, which is adjacent to the transfer gate TG.

In some example embodiments, as shown in FIG. 2, a first pixel PX-1, a second pixel PX-2, a third pixel PX-3, and a fourth pixel PX-4 may be arranged in a matrix. The first pixel PX-1 and the third pixel PX-3, which are in line in the second horizontal direction (the Y direction), may be in mirror symmetry. The first pixel PX-1 and the second pixel PX-2, which are in line in the first horizontal direction (the X direction), may be in mirror symmetry. Each of the first to fourth pixels PX-1, PX-2, PX-3, and PX-4 may include the transfer gate TG. However, FIG. 2 shows the layout of transistors according to some example embodiments, and the layout of transistors or the shape of the active region ACT is not limited thereto.

The transfer gate TG may include a first edge eg1, which overlaps with the first active region ACT1 in a vertical direction (the Z direction), and a plurality of second edges eg2, which are separated from the first active region ACT1 in the horizontal direction (the X direction and/or the Y direction), for example such that the plurality of second edges eg2 are each exposed from (e.g., do not overlap) the first active region ACT1 in the vertical direction (the Z direction). Each of the second edges eg2 of the transfer gate TG may also be separated from the second active region ACT2 in the horizontal direction (the X direction and/or the Y direction), for example such that the plurality of second edges eg2 are each exposed from (e.g., do not overlap) the second active region ACT2 in the vertical direction (the Z direction).

A third angle $\theta_3$ between the first edge eg1 of the transfer gate TG and the pixel isolation structure 120 extending in the first horizontal direction (the X direction) may be about 45 degrees. For example, the extension direction of the first edge eg1 of the transfer gate TG may be different from the extension direction of the side wall ERSS of the extension part ER and/or the extension direction of the side wall CRSS of the center part CR. For example, the extension direction of the first edge eg1 of the transfer gate TG may be the same as the extension direction of the side wall ERSS of the extension part ER or the extension direction of the side wall CRSS of the center part CR. In some example embodiments, the third angle $\theta_3$ may exceed (e.g., may be greater than) about 45 degrees (e.g., between about 45 degrees and about 90 degrees, between about 45 degrees and about 120 degrees, etc.).

A fourth angle $\theta_4$ between the second edges eg2 of the transfer gate TG may be about 90 degrees. For example, at least one of the second edges eg2 of the transfer gate TG may extend in the first horizontal direction (the X direction) and/or the second horizontal direction (the Y direction). In some example embodiments, the fourth angle $\theta_4$ may be less than or equal to about 90 degrees (e.g., between 0 degrees and about 90 degrees, between about 45 degrees and about 90 degrees, etc.). In some example embodiments, the fourth angle $\theta_4$ may be greater than or equal to about 90 degrees (e.g., between about 90 degrees and about 120 degrees, between about 90 degrees and about 180 degrees, etc.). In some example embodiments, the third angle $\theta_3$ may exceed (e.g., may be greater than) about 45 degrees or the fourth angle $\theta_4$ may be greater than or equal to about 90 degrees.

In some example embodiments, in a plan view, the first angle $\theta_1$ may exceed about 45 degrees, the second angle $\theta_2$ may be less than about 90 degrees, the third angle $\theta_3$ may exceed about 45 degrees, and the fourth angle $\theta_4$ may be greater than or equal to about 90 degrees.

In some example embodiments, the transfer gate TG may form a transfer transistor TX (in FIG. 4), and the transfer transistor TX may be configured to transfer charge generated in a photoelectric conversion region PD to the floating diffusion region FD. The reset gate RG (in FIG. 4) may form a reset transistor RX (in FIG. 4), and the reset transistor RX may be configured to periodically reset the charge stored in the floating diffusion region FD. A drive transistor DX (in FIG. 4) may function as a source follower buffer amplifier and may be configured to buffer a signal corresponding to the charge stored in the floating diffusion region FD. The select gate SG may form a select transistor SX (in FIG. 4), and the select transistor SX may perform switching and addressing to select a pixel PX.

In some example embodiments, based on the respective shapes of the extension part ER and the transfer gate TG at least partially defined by one or more of the first to fourth angles $\theta_1$ to $\theta_4$, including the cross-sectional shapes thereof in a horizontal direction extending parallel to the first surface 110F1 of the semiconductor substrate 110, may result in an increased overlap in the vertical direction (Z direction) (e.g., an increased horizontal area of overlap in a plan view) between the active region ACT and the transfer gate TG in each pixel PX, which may thereby improve the reliability and generated image quality and/or resolution (and thus improve the operational performance) of the image sensor 100 while enabling increased compactness (e.g., increased miniaturization) of the image sensor 100.

Referring to FIG. 3, the transfer gate TG may be referred to as a buried gate structure 130. The buried gate structure 130 may be arranged in a buried gate trench 130T which extends from the first surface 110F1 of the semiconductor substrate 110 into the semiconductor substrate 110.

In some example embodiments, the buried gate structure 130 may include a buried gate electrode 132, a buried gate insulating layer 134, and a buried gate spacer 136. The buried gate electrode 132 may include at least one selected from the group consisting of doped polysilicon, metal, metal silicide, metal nitride, and a metal-containing layer. The buried gate insulating layer 134 may be on the inner wall of the buried gate trench 130T and may surround the side wall and bottom surface of the buried gate electrode 132. The buried gate spacer 136 may be on a side wall of the buried gate electrode 132.

An interlayer insulating layer 150 may be on the first surface 110F1 of the semiconductor substrate 110. The interlayer insulating layer 150 may cover the active region ACT, the isolation layer 115, and the buried gate structure 130.

In some example embodiments, the interlayer insulating layer 150 may include silicon nitride or silicon oxynitride. In some example embodiments, an etch stop layer (not shown) may be between the interlayer insulating layer 150 and the first surface 110F1 of the semiconductor substrate 110. The etch stop layer may include a material having an etch selectivity with respect to the interlayer insulating layer 150.

A contact 152 may pass through the interlayer insulating layer 150 and the isolation layer 115 and be in contact with the semiconductor substrate 110 and/or the buried gate structure 130.

The contact 152 may be in a contact hole 150H, which passes through the interlayer insulating layer 150. In some example embodiments, the contact 152 may include a barrier conductive layer (not shown) on the inner wall of the contact hole 150H and a contact conductive layer 152F, which is on the barrier conductive layer and fills the contact hole 150H. For example, the barrier conductive layer may include at least one selected from the group consisting of titanium (Ti), titanium nitride (TiN), tantalum (Ta), tantalum nitride (TaN), ruthenium (Ru), tungsten nitride (WN), and niobium nitride (NbN). The contact conductive layer 152F may include at least one selected from the group consisting of tungsten (W), cobalt (Co), copper (Cu), aluminum (A1), and WN.

An upper wiring structure 170 may be on the interlayer insulating layer 150. The upper wiring structure 170 may have a stack structure of a plurality of layers. The upper wiring structure 170 may include an insulating layer 172, a wiring layer 174, and a via contact 176. The insulating layer 172 may include an insulating material, such as silicon oxide, silicon nitride, or silicon oxynitride. The wiring layer 174 and the via contact 176 may include at least one selected from the group consisting of polysilicon doped or not doped with impurities, metal, metal silicide, metal nitride, and a metal-containing layer. For example, the wiring layer 174 and the via contact 176 may include W. A1, Cu, tungsten silicide, titanium silicide, WN, TiN, or doped polysilicon.

A backside insulating layer 182 may be on the second surface 110F2 of the semiconductor substrate 110. The backside insulating layer 182 may be on the entire area or substantially the entire area of the second surface 110F2 of the semiconductor substrate 110 and may be in contact with the top surface of the pixel isolation structure 120, which is at the same level (e.g., same distance from the first surface 110F1 of the substrate in the vertical direction, or Z direction) as the second surface 110F2 of the semiconductor substrate 110. In some example embodiments, the backside insulating layer 182 may include metal oxide, such as hafnium oxide, aluminum oxide, or tantalum oxide. In some example embodiments, the backside insulating layer 182 may include an insulating material, such as silicon oxide, silicon nitride, silicon oxynitride, or a low-k material.

A passivation layer 184 may be on the backside insulating layer 182, and a color filter 186 and a microlens 188 may be on the passivation layer 184. Selectively, a support substrate (not shown) may be further arranged on the first surface 110F1 of the semiconductor substrate 110.

Figure 4:
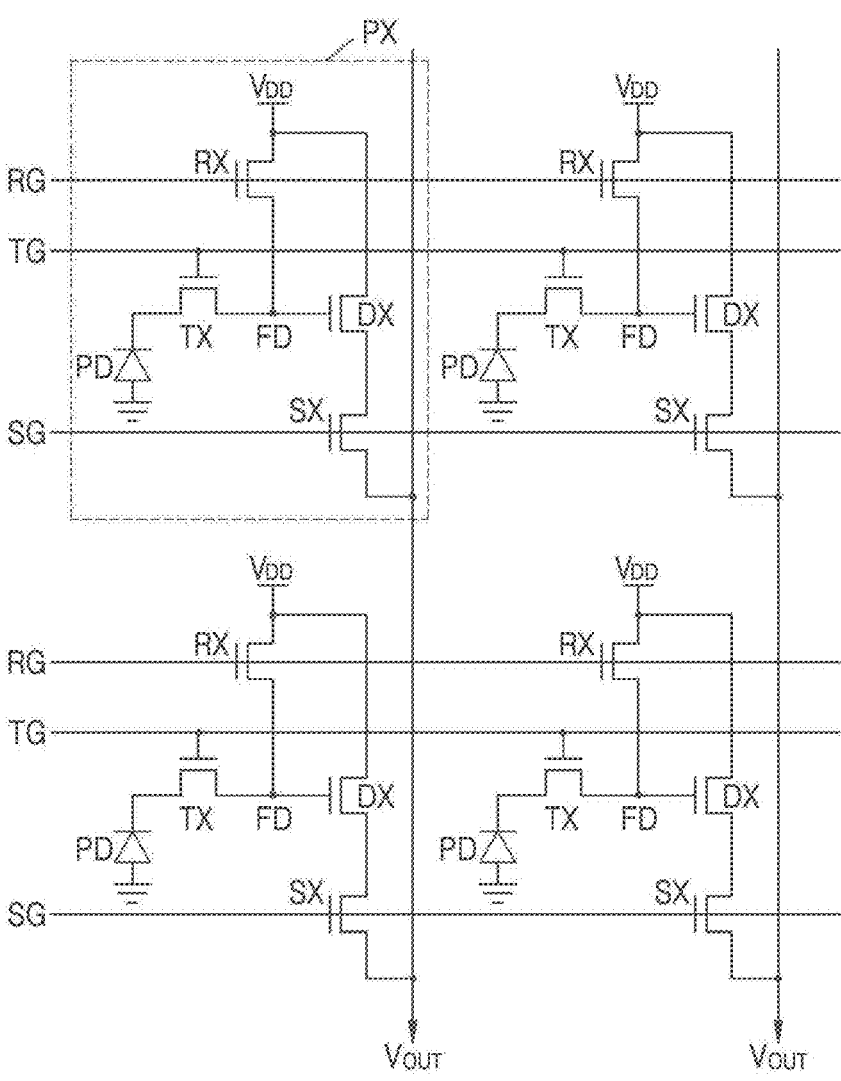
FIG. 4 is an equivalent circuit diagram of pixels of an image sensor, according to some example embodiments.

FIG. 4 is an equivalent circuit diagram of pixels of an image sensor, according to some example embodiments.

Referring to FIG. 4, a plurality of pixels PX may be arranged in a matrix. Each of the pixels PX may include the transfer transistor TX and logic transistors. Here, the logic transistors may include the reset transistor RX, the select transistor SX, and the drive transistor DX (or a source follower transistor). The reset transistor RX may include the reset gate RG, the select transistor SX may include the select gate SG, and the transfer transistor TX may include the transfer gate TG.

Each of the pixels PX may further include the photoelectric conversion region PD and the floating diffusion region FD. Each pixel PX of the pixels PX may include a separate photoelectric conversion region PD. Each pixel PX of the pixels PX may include a separate floating diffusion region FD. The photoelectric conversion region PD may correspond to one of the photoelectric conversion regions PD described with reference to FIGS. 1 to 3. The photoelectric conversion region PD may generate and accumulate photocharge in proportion to the quantity of incident light and may include a photodiode, a phototransistor, a photogate, a pinned photodiode (PPD), or a combination thereof.

The transfer gate TG may transfer charge generated in the photoelectric conversion region PD to the floating diffusion region FD. The floating diffusion region FD may receive and accumulatively store charge generated in the photoelectric conversion region PD. The drive transistor DX may be controlled according to the amount of photocharges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power supply voltage $V_{DD}$. When the reset transistor RX is turned on, the power supply voltage $V_{DD}$ connected to the source electrode of the reset transistor RX may be transmitted to the floating diffusion region FD. When the reset transistor RX is turned on, the charges accumulated in the floating diffusion region FD may be discharged such that the floating diffusion region FD is reset.

The drive transistor DX may be connected to a current source (not shown) outside the pixels PX to function as a source follower buffer amplifier. The drive transistor DX may amplify a potential change in the floating diffusion region FD and output an amplified result to an output line $V_{OUT}$.

The select transistor SX may select a plurality of pixels PX in units of rows. When the select transistor SX is turned on, the power supply voltage $V_{DD}$ may be transmitted to the source electrode of the drive transistor DX.

Figure 5:
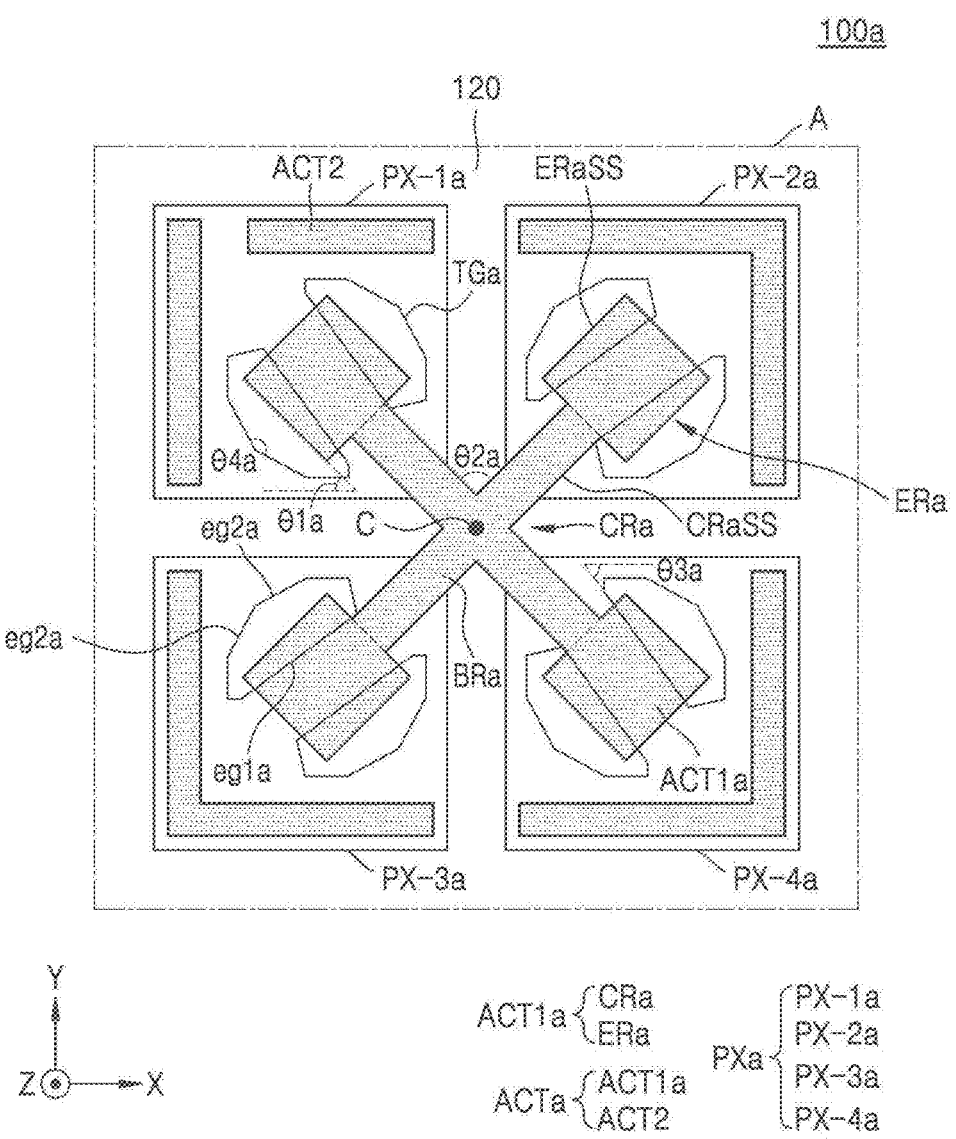
FIG. 5 illustrates an enlarged layout of the region A in FIG. 1, according to some example embodiments.

FIG. 5 illustrates an enlarged layout of the region A in FIG. 1, according to some example embodiments. FIGS. 1 to 4 are also referred to, and redundant descriptions that have been made with reference to FIGS. 1 to 4 are briefly given or omitted.

Referring to FIG. 5, an image sensor 100a may include a plurality of pixels PXa (i.e., first to fourth pixels PX-1a, PX-2a, PX-3a, and PX-4a), each including an active region ACTa and a transfer gate TGa.

The active region ACTa may include a first active region ACT1a and the second active region ACT2. The first active region ACT1a may include a center part CRa and an extension part ERa. For example, a first angle $\theta_1a$ between a side wall ERaSS of the extension part ERa and the pixel isolation structure 120 extending in the first horizontal direction (the X direction) may be about 45 degrees. A second angle $\theta_2a$ between two adjacent branching sections BRa may be about 90 degrees. For example, the extension direction of the side wall ERaSS of the extension part ERa may be the same as the extension direction of a side wall CRaSS of the center part CRa.

The transfer gate TGa may include a first edge eg1a, which overlaps with the first active region ACT1a in the vertical direction (the Z direction), and a plurality of second edges eg2a, which are separated from the first active region ACT1a in the horizontal direction (the X direction and/or the Y direction). Each of the second edges eg2a of the transfer gate TGa may also be separated from the second active region ACT2 in the horizontal direction (the X direction and/or the Y direction).

A third angle $\theta_3a$ between the first edge eg1a of the transfer gate TGa and the pixel isolation structure 120 extending in the first horizontal direction (the X direction) may be greater than about 45 degrees and less than or equal to about 90 degrees. For example, the extension direction of the first edge eg1a of the transfer gate TGa may be different from the extension direction of the side wall ERaSS of the extension part ERa and/or the extension direction of the side wall CRaSS of the center part CRa. For example, the extension direction of the first edge eg1a of the transfer gate TGa may be the same as the extension direction of the side wall ERaSS of the extension part ERa or the extension direction of the side wall CRaSS of the center part CRa.

A fourth angle $\theta_4a$ between the two edges eg2a of the transfer gate TGa may be greater than or equal to about 90 degrees and less than or equal to about 180 degrees. For example, at least one of the second edges eg2a may extend in a diagonal direction that is different from each of the first horizontal direction (the X direction) and the second horizontal direction (the Y direction) on a horizontal plane.

Figure 6:
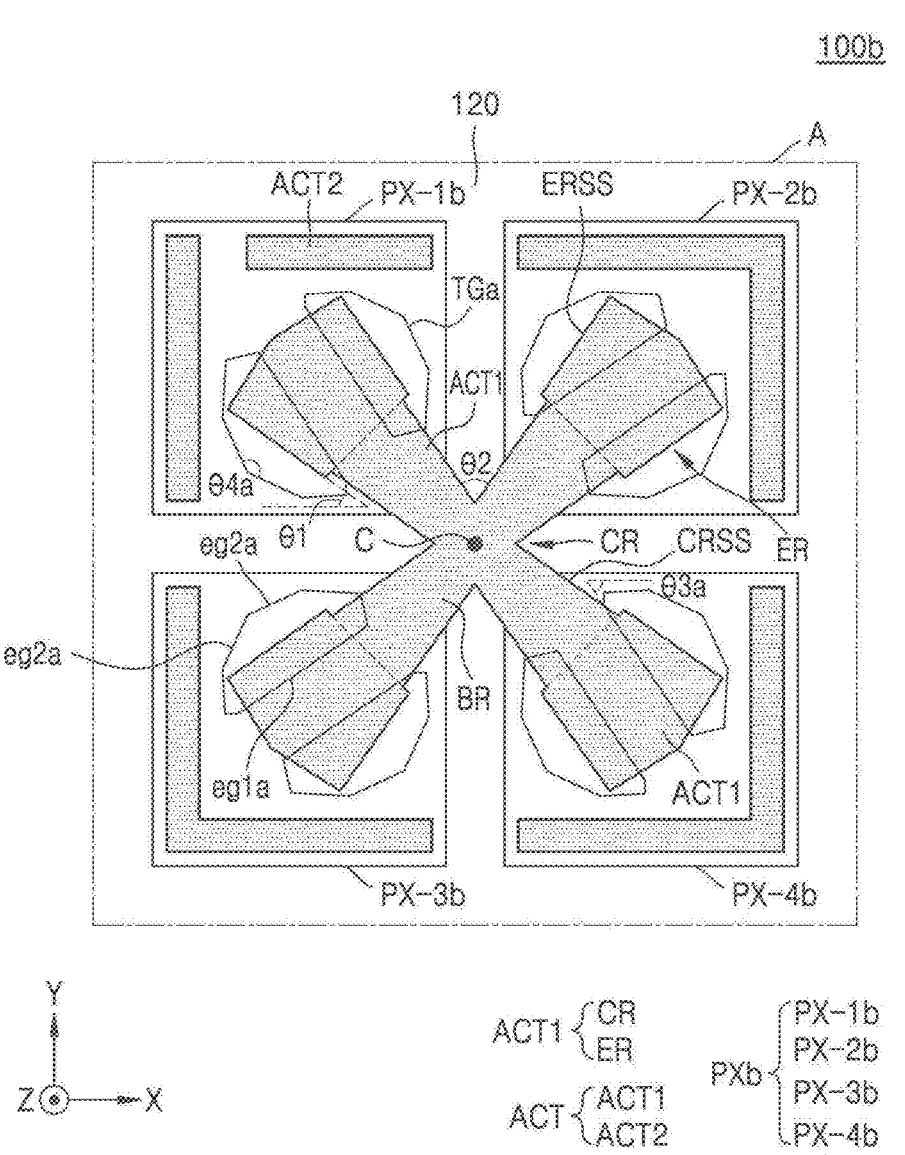
FIG. 6 illustrates an enlarged layout of the region A in FIG. 1, according to some example embodiments.

FIG. 6 illustrates an enlarged layout of the region A in FIG. 1, according to some example embodiments.

Referring to FIG. 6, an image sensor 100b may include a plurality of pixels PXb (i.e., first to fourth pixels PX-1b, PX-2b, PX-3b, and PX-4b), each including the active region ACT and the transfer gate TGa.

The first angle $\theta_1$ between the side wall ERSS of the extension part ER and the pixel isolation structure 120 extending in the first horizontal direction (the X direction) may be greater than about 45 degrees and less than or equal to about 90 degrees. In some example embodiments, the first angle $\theta_1$ may exceed (e.g., may be greater than) about 45 degrees (e.g., between about 45 degrees and about 120 degrees, etc.). The second angle $\theta_2$ between two adjacent branching sections BR may be greater than or equal to about 45 degrees and less than about 90 degrees. In some example embodiments, the second angle $\theta_2$ may be less than about 90 degrees (e.g., between 0 degrees and about 90 degrees, between about 30 degrees and about 90 degrees, etc.). To meet the above ranges of the first angle $\theta_1$ and the second angle $\theta_2$, the location and shape of the isolation layer 115 may vary. In some example embodiments, the first angle $\theta_1$ may exceed (e.g., may be greater than) about 45 degrees or the second angle $\theta_2$ may be less than about 90 degrees.

The third angle $\theta_3a$ between the first edge eg1a of the transfer gate TGa and the pixel isolation structure 120 extending in the first horizontal direction (the X direction) may be greater than about 45 degrees and less than or equal to about 90 degrees. For example, the extension direction of the first edge eg1a of the transfer gate TGa may be different from the extension direction of the side wall ERSS of the extension part ER and/or the extension direction of the side wall CRSS of the center part CR. For example, the extension direction of the first edge eg1a of the transfer gate TGa may be the same as the extension direction of the side wall ERSS of the extension part ER or the extension direction of the side wall CRSS of the center part CR. In some example embodiments, the third angle $\theta_3a$ may exceed (e.g., may be greater than) about 45 degrees (e.g., between about 45 degrees and about 90 degrees, between about 45 degrees and about 120 degrees, etc.).

The fourth angle $\theta_4a$ between the two edges eg2a of the transfer gate TGa may be greater than or equal to about 90 degrees and less than or equal to about 180 degrees. For example, at least one of the second edges eg2a may extend in a direction that is different from each of the first horizontal direction (the X direction) and the second horizontal direction (the Y direction).

For example, the first angle $\theta_1$ may be greater than or equal to about 60 degrees and less than or equal to about 70 degrees, the second angle $\theta_2$ may be greater than or equal to about 80 degrees and less than about 90 degrees, the third angle $\theta_3a$ may be greater than or equal to about 65 degrees and less than or equal to about 75 degrees, and the fourth angle $\theta_4a$ may be greater than or equal to about 90 degrees and less than or equal to about 100 degrees.

For example, the first angle $\theta_1$ may be different from the third angle $\theta_3a$. In other words, the extension direction of the side wall ERSS of the extension part ER of the first active region ACT1 may be different from the extension direction of the first edge eg1a of the transfer gate TGa. For example, the second angle $\theta_2$ may be different from the fourth angle $\theta_4a$. In other words, the extension direction of the side wall CRSS of the center part CR of the first active region ACT1 may be different from the extension direction of each of the second edges eg2a of the transfer gate TGa.

In a plan view, the area of the horizontal cross-section of the overlap between the active region ACT and the transfer gate TGa in the vertical direction (the Z direction) may be at least about 0.05 $\mu m^2$. In other words, the area of the horizontal cross-section of the overlap between the first active region ACT1 and the transfer gate TGa in the vertical direction (the Z direction) may be at least about 0.05 $\mu m^2$. For example, when a pixel PX includes two transfer gates TGa, the area of a horizontal cross-section of the overlap between the first active region ACT1 and the transfer gates TGa in the vertical direction (the Z direction) may be at least about 0.1 $\mu m^2$. Such overlap in the vertical direction (Z direction) (e.g., horizontal area of overlap in a plan view) between the active region ACT and the transfer gate TGa in each pixel PXb may result in improved reliability and generated image quality and/or resolution (and thus improved operational performance) of the image sensor 100b while enabling compactness (e.g., miniaturization) of the image sensor 100b.

Figure 7:
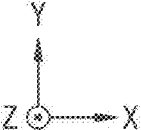
FIG. 7 is a diagram of an example of an arrangement of active regions, according to some example embodiments.

FIG. 7 is a diagram of an example of an arrangement of active regions, according to some example embodiments. FIG. 8 is a diagram of an example of an arrangement of transfer gates, according to some example embodiments. FIGS. 1 to 6 are also referred to, and redundant descriptions that have been made with reference to FIGS. 1 to 6 are briefly given or omitted.

Referring to FIGS. 7 and 8, the active regions ACT and ACTa and the transfer gates TG and TGa may be arranged in various combinations in a two-dimensional (2D) array. For example, the active regions ACT and ACTa and the transfer gates TG and TGa may be arranged on the semiconductor substrate 110 in various combinations in a matrix of columns and rows. For example, an array may refer to a pixel PX, which includes the active region ACT or ACTa and the transfer gate TG or TGa.

A to J, A' to J', and A" to J" may each indicate an angle. A to J may represent the first angle $\theta_1$ and the second angle $\theta_2$. A' to J' may represent the third angle $\theta_3a$, and A" to J" may represent the fourth angle $\theta_4a$.

For example, A and A' may indicate about 45 degrees, B and B' may indicate about 50 degrees, C and C' may indicate about 55 degrees, D and D' may indicate about 60 degrees, E and E' may indicate about 65 degrees, F and F' may indicate about 70 degrees, G and G' may indicate about 75 degrees, H and H' may indicate about 80 degrees, I and I' may indicate about 85 degrees, and J and J' may indicate about 90 degrees. A" may indicate about 90 degrees, B" may indicate about 100 degrees, C" may indicate about 110 degrees, D" may indicate about 120 degrees, E" may indicate about 130 degrees, F" may indicate about 140 degrees, G" may indicate about 150 degrees, H" may indicate about 160 degrees, I" may indicate about 170 degrees, and J" may indicate about 180 degrees.

Although it is illustrated in FIGS. 7 and 8 that the first to third angles $\theta_1$, $\theta_2$, and $\theta_3a$ change by about 5 degrees and the fourth angle $\theta_4a$ changes by about 10 degrees when the active regions ACT and ACTa and the transfer gates TG and TGa are formed, this is just an example, and the inventive concepts are not limited thereto. The first to fourth angles $\theta_1$, $\theta_2$, $\theta_3a$, $\theta_4a$ may change at different intervals than those described above when the active regions ACT and ACTa and the transfer gates TG and TGa are formed.

Referring to FIG. 7, in a two-digit character string, the first character may refer to the first angle $\theta_1$, and the second character may refer to the second angle $\theta_2$. For example, in the case of EA, the first angle $\theta_1$ may be about 65 degrees and the second angle $\theta_2$ may be about 45 degrees. In one column, first angles $\theta_1$ may be the same. In one row, second angles $\theta_2$ may be the same.

Referring to FIG. 8, in a two-digit character string, the first character may refer to the third angle $\theta_3a$ and the second character may refer to the fourth angle $\theta_4a$. For example, in the case of H'I", the third angle $\theta_3a$ may be about 80 degrees and the fourth angle $\theta_4a$ may be about 170 degrees. In one column, third angles $\theta_3a$ may be the same. In one row, fourth angles $\theta_4a$ may be the same.

When the first to fourth angles $\theta_1$, $\theta_2$, $\theta_3a$, $\theta_4a$ are changed, the area of the horizontal cross-section of the overlap between the active region ACT or ACTa and the transfer gate TG or TGa in the vertical direction (the Z direction) may be increased or maximized. For example, the area of the horizontal cross-section of the overlap between the active region ACT or ACTa and the transfer gate TG or TGa in the vertical direction (the Z direction) may be at least about 0.05 $\mu m^2$. Such overlap in the vertical direction (e.g., horizontal area of overlap in a plan view) between the active region ACT or ACTa and the transfer gate TG or TGa may result in improved reliability and generated image quality and/or resolution (and thus improved operational performance) of an image sensor while enabling compactness (e.g., miniaturization) of the image sensor.

Figure 9:
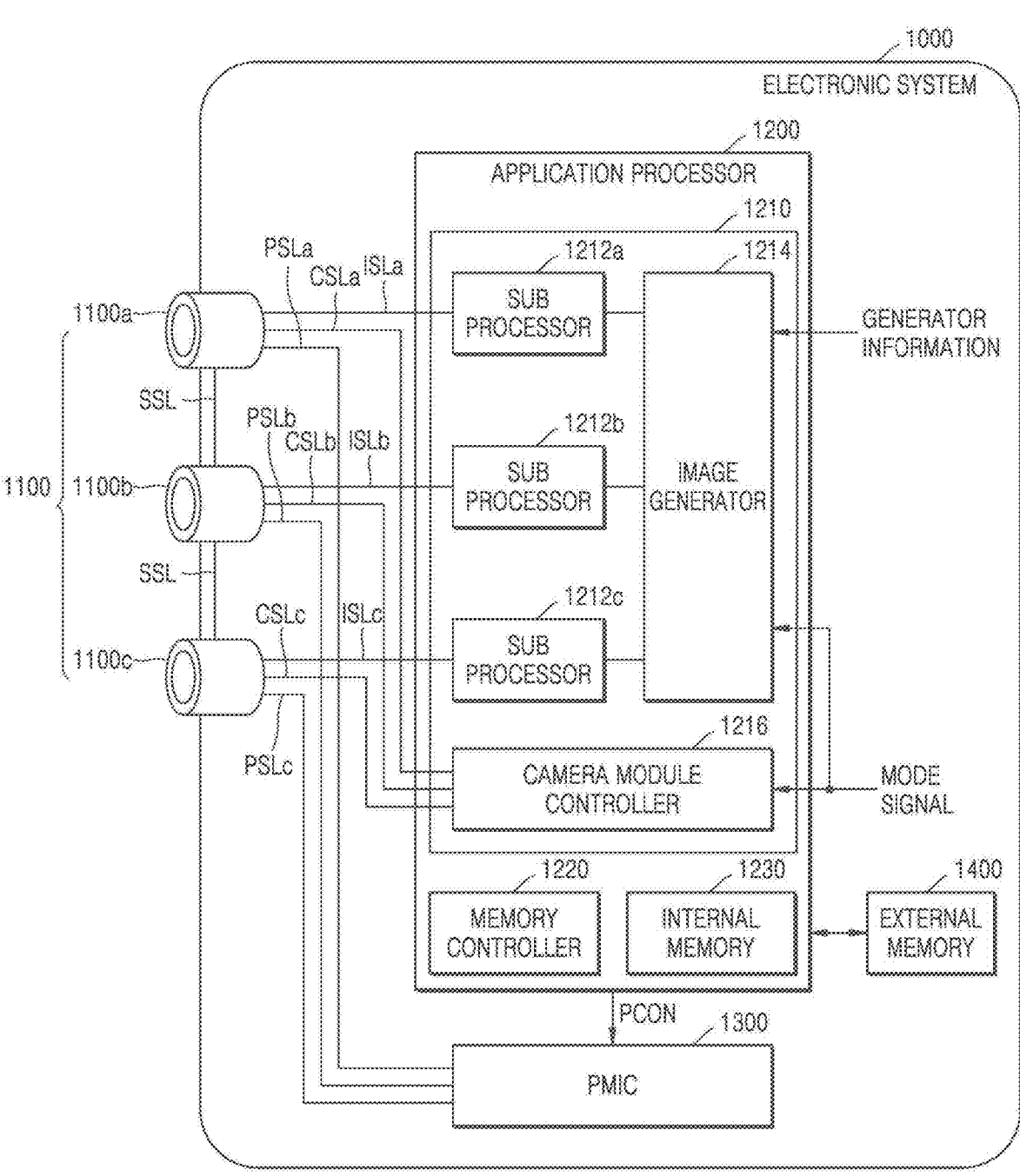
FIG. 9 is a diagram of an electronic system according to some example embodiments.
Figure 10:
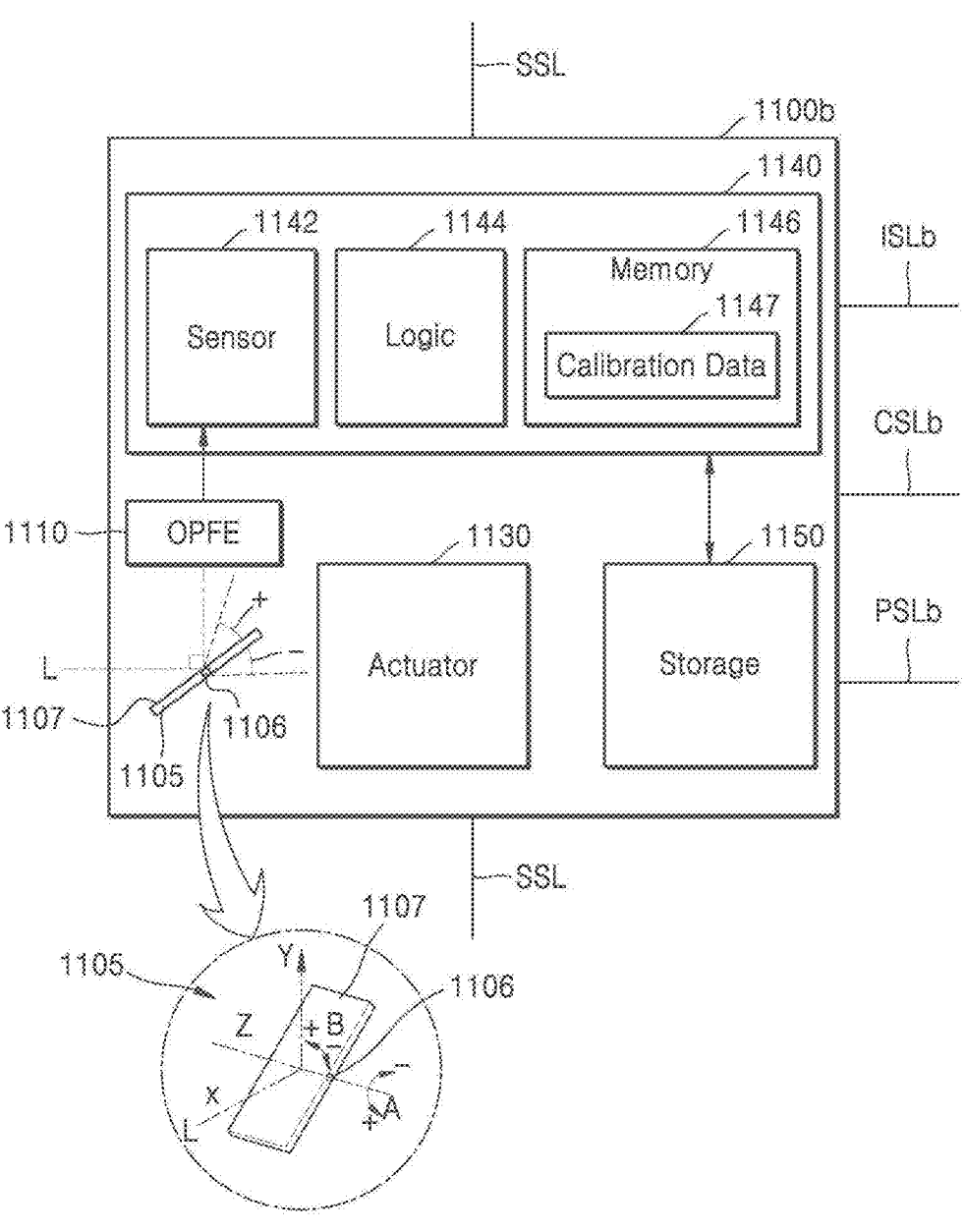
FIG. 10 is a detailed diagram of a camera module of the electronic system of FIG. 9.

FIG. 9 is a diagram of an electronic system according to some example embodiments, and FIG. 10 is a detailed diagram of a camera module of the electronic system of FIG. 9.

Referring to FIG. 9, an electronic system 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 9, the inventive concepts are not limited thereto. In some example embodiments, the camera module group 1100 may be modified to include only two camera modules. In some example embodiments, the camera module group 1100 may be modified to include "n" camera modules, where "n" is a natural number of at least 4.

The detailed configuration of the camera module 1100*b* is described with reference to FIG. 10 below. The descriptions below may also be applied to the other camera modules 1100*a* and 1100*c*.

Referring to FIG. 10, the camera module 1100*b* may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some example embodiments, the prism 1105 may change the path of the light L incident in a first direction (the X direction in FIG. 10) into a second direction (the Y direction in FIG. 10) perpendicular to the first direction (the X direction). The prism 1105 may rotate the reflective surface 1107 of the light reflecting material in a direction A around a central shaft 1106 or rotate the central shaft 1106 in a direction B so that the path of the light L incident in the first direction (the X direction) is changed into the second direction (the Y direction) that is perpendicular to the first direction (the X direction). At this time, the OPFE 1110 may move in a third direction (the Z direction in FIG. 10) that is perpendicular to the first direction (the X direction) and the second direction (the Y direction).

In some example embodiments, as shown in FIG. 10, an A-direction maximum rotation angle of the prism 1105 may be less than or equal to 15 degrees in a plus (+) A direction and greater than 15 degrees in a minus (−) A direction, but the inventive concepts are not limited thereto.

In some example embodiments, the prism 1105 may move by an angle of about 20 degrees or in a range from about 10 degrees to about 20 degrees or from about 15 degrees to about 20 degrees in a plus or minus B direction. At this time, an angle by which the prism 1105 moves in the plus B direction may be the same as or similar, within a difference of about 1 degree, to an angle by which the prism 1105 moves in the minus B direction.

In some example embodiments, the prism 1105 may move the reflective surface 1107 of the light reflecting material in the third direction (the Z direction) that is parallel with the extension direction of the central shaft 1106.

The OPFE 1110 may include, for example, "m" optical lenses, where "m" is a natural number. The "m" lenses may move in the second direction (the Y direction) and change an optical zoom ratio of the camera module 1100*b*. For example, when the default optical zoom ratio of the camera module 1100*b* is Z, the optical zoom ratio of the camera module 1100*b* may be changed to 3Z, 5Z, or greater by moving the "m" optical lenses included in the OPFE 1110.

The actuator 1130 may move the OPFE 1110 (or an optical lens) (hereinafter, referred to as an optical lens) to a certain position. For example, the actuator 1130 may adjust the position of the optical lens such that an image sensor 1142 is at a focal length of the optical lens for accurate sensing.

The image sensing device 1140 may include the image sensor 1142, a control logic 1144, and a memory 1146. The image sensor 1142 may sense an image of an object by using the light L provided through the optical lens. The control logic 1144 may generally control operations of the camera module 1100*b*. For example, the control logic 1144 may control operation of the camera module 1100*b* according to a control signal provided through a control signal line CSLb.

The memory 1146 may store information, such as calibration data 1147, necessary for the operation of the camera module 1100*b*. The calibration data 1147 may include information, which is necessary for the camera module 1100*b* to generate image data using the light L provided from outside. For example, the calibration data 1147 may include information about the degree of rotation described above, information about a focal length, information about an optical axis, or the like. When the camera module 1100*b* is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some example embodiments, the storage 1150 may include electrically erasable programmable read-only memory (EEPROM), but the inventive concepts are not limited thereto.

The image sensor 1142 may include at least one of the image sensor 100, 100*a*, and 100*b* described with reference to FIGS. 1 to 8 or an image sensor resulting from changing and modifying the image sensors 100, 100*a*, and 100*b* without departing from the scope of the inventive concepts.

Referring to FIGS. 9 and 10, in some example embodiments, each of the camera modules 1100*a*, 1100*b*, and 1100*c* may include the actuator 1130. Accordingly, the camera modules 1100*a*, 1100*b*, and 1100*c* may include the calibration data 1147, which is the same or different among the camera modules 1100*a*, 1100*b*, and 1100*c* according to the operation of the actuator 1130 included in each of the camera modules 1100*a*, 1100*b*, and 1100*c*.

In some example embodiments, one (e.g., the camera module 1100*b*) of the camera modules 1100*a*, 1100*b*, and 1100*c* may be of a folded-lens type including the prism 1105 and the OPFE 1110 while the other camera modules (e.g., the camera modules 1100*a* and 1100*c*) may be of a vertical type that does not include the prism 1105 and the OPFE 1110. However, embodiments are not limited thereto.

In some example embodiments, one (e.g., the camera module 1100*c*) of the camera modules 1100*a*, 1100*b*, and 1100*c* may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100*a* or 1100*b*).

In some example embodiments, at least two camera modules (e.g., 1100*a* and 1100*b*) among the camera modules 1100*a*, 1100*b*, and 1100*c* may have different field-of-views. In this case, the two camera modules (e.g., 1100*a* and 1100*b*) among the camera modules 1100*a*, 1100*b*, and 1100*c* may respectively have different optical lenses, but embodiments are not limited thereto.

In some example embodiments, the camera modules 1100*a*, 1100*b*, and 1100*c* may have different field-of-views from one another. In this case, the camera modules 1100*a*, 1100*b*, and 1100*c* may respectively have different optical lenses, but embodiments are not limited thereto.

In some example embodiments, the camera modules 1100*a*, 1100*b*, and 1100*c* may be physically separated from one another. In other words, the sensing area of the image sensor 1142 is not divided and used by the camera modules

1100*a*, 1100*b*, and 1100*c*, but the image sensor 1142 may be independently included in each of the camera modules 1100*a*, 1100*b*, and 1100*c*.

Referring back to FIG. 9, the application processor 1200 may include an image processing unit 1210, a memory controller 1220, and an internal memory 1230. The application processor 1200 may be separately implemented from the camera modules 1100*a*, 1100*b*, and 1100*c*. For example, the application processor 1200 may be implemented in a different semiconductor chip than the camera modules 1100*a*, 1100*b*, and 1100*c*.

The image processing unit 1210 may include a plurality of sub processors 1212*a*, 1212*b*, and 1212*c*, an image generator 1214, and a camera module controller 1216. The image processing unit 1210 may include as many sub processors 1212*a*, 1212*b*, and 1212*c* as the camera modules 1100*a*, 1100*b*, and 1100*c*.

Pieces of image data respectively generated from the camera modules 1100*a*, 1100*b*, and 1100*c* may be respectively provided to the sub processors 1212*a*, 1212*b*, and 1212*c* respectively through image signal lines ISLa, ISLb, and ISLc, which are separated from one another. For example, image data generated from the camera module 1100*a* may be provided to the sub processor 1212*a* through the image signal line ISLa, image data generated from the camera module 1100*b* may be provided to the sub processor 1212*b* through the image signal line ISLb, and image data generated from the camera module 1100*c* may be provided to the sub processor 1212*c* through the image signal line ISLc. Such image data transmission may be performed using, for example, a mobile industry processor interface (MIPI)-based camera serial interface (CSI), but the inventive concepts are not limited thereto.

In some example embodiments, a single sub processor may be provided for a plurality of camera modules. For example, differently from FIG. 9, the sub processors 1212*a* and 1212*c* may not be separate from each other but may be integrated into a single sub processor, and the image data provided from the camera module 1100*a* or the camera module 1100*c* may be selected by a selection element (e.g., a multiplexer) and then provided to the integrated sub processor.

The image data provided to each of the sub processors 1212*a*. 1212*b*, and 1212*c* may be provided to the image generator 1214. The image generator 1214 may generate an output image using the image data provided from each of the sub processors 1212*a*, 1212*b*, and 1212*c* according to generator information or a mode signal.

In detail, the image generator 1214 may generate the output image by merging at least portions of respective pieces of image data, which are respectively generated from the camera modules 1100*a*, 1100*b*, and 1100*c* having different field-of-views, according to the generator information or the mode signal. In some example embodiments, the image generator 1214 may generate the output image by selecting one of pieces of image data, which are respectively generated from the camera modules 1100*a*, 1100*b*, and 1100*c* having different field-of-views, according to the generator information or the mode signal.

In some example embodiments, the generator information may include a zoom signal or a zoom factor. In some example embodiments, the mode signal may be based on a mode selected by a user.

When the generator information includes a zoom signal or a zoom factor and the camera modules 1100*a*, 1100*b*, and 1100*c* have different field-of-views, the image generator 1214 may perform different operations according to different kinds of zoom signals. For example, when the zoom signal is a first signal, the image generator 1214 may merge image data output from the camera module 1100*a* and image data output from the camera module 1100*c* into a merged image signal and generate an output image using the merged image data and image data, which is output from the camera module 1100*b* and is not used in the merging. When the zoom signal is a second signal different from the first signal, the image generator 1214 may generate an output image by selecting one of the pieces of image data respectively output from the camera modules 1100*a*, 1100*b*, and 1100*c*, instead of performing the merging. However, the inventive concepts are not limited thereto, and a method of processing image data may be changed whenever necessary.

In some example embodiments, the image generator 1214 may receive a plurality of pieces of image data, which have different exposure times, from at least one of the sub processors 1212*a*, 1212*b*, and 1212*c* and perform high dynamic range (HDR) processing on the pieces of image data, thereby generating merged image data having an increased dynamic range.

The camera module controller 1216 may provide a control signal to each of the camera modules 1100*a*, 1100*b*, and 1100*c*. A control signal generated by the camera module controller 1216 may be provided to its corresponding one of the camera modules 1100*a*, 1100*b*, and 1100*c* through its corresponding one of control signal lines CSLa, CSLb, and CSLc, which are separate from one another.

One of the camera modules 1100*a*, 1100*b*, and 1100*c*. e.g., the camera module 1100*b*, may be designated as a master camera according to the mode signal or the generator information including a zoom signal, and the other camera modules, e.g., the camera modules 1100*a* and 1100*c*, may be designated as slave cameras. Such designation information may be included in a control signal and provided to each of the camera modules 1100*a*, 1100*b*, and 1100*c* through its corresponding one of control signal lines CSLa, CSLb, and CSLc, which are separate from one another.

A camera module operating as a master or a slave may be changed according to a zoom factor or an operation mode signal. For example, when the field-of-view of the camera module 1100*a* is greater than that of the camera module 1100*b* and the zoom factor indicates a low zoom ratio, the camera module 1100*b* may operate as a master and the camera module 1100*a* may operate as a slave. Contrarily, when the zoom factor indicates a high zoom ratio, the camera module 1100*a* may operate as a master and the camera module 1100*b* may operate as a slave.

In some example embodiments, a control signal provided from the camera module controller 1216 to each of the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit the sync enable signal to the camera module 1100*b*. The camera module 1100*b* provided with the sync enable signal may generate a sync signal based on the sync enable signal and may provide the sync signal to the camera modules 1100*a* and 1100*c* through a sync signal line SSL. The camera modules 1100*a*, 1100*b*, and 1100*c* may be synchronized with the sync signal and may transmit image data to the application processor 1200.

In some example embodiments, a control signal provided from the camera module controller 1216 to each of the camera modules 1100*a*, 1100*b*, and 1100*c* may include mode information according to the mode signal. The camera modules 1100*a*, 1100*b*, and 1100*c* may operate in a first operation mode or a second operation mode in relation with a sensing speed, based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. At this time, the second speed may be at most 30 times the first speed.

The application processor 1200 may store the received image signal, i.e., the encoded image signal, in the internal memory 1230 or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under control by the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. At this time, the power control signal PCON may include information about a camera module to operate in the low-power mode and a power level to be set. The same or different levels of power may be respectively provided to the camera modules 1100a, 1100b, and 1100c. The level of power may be dynamically changed.

Figure 11:
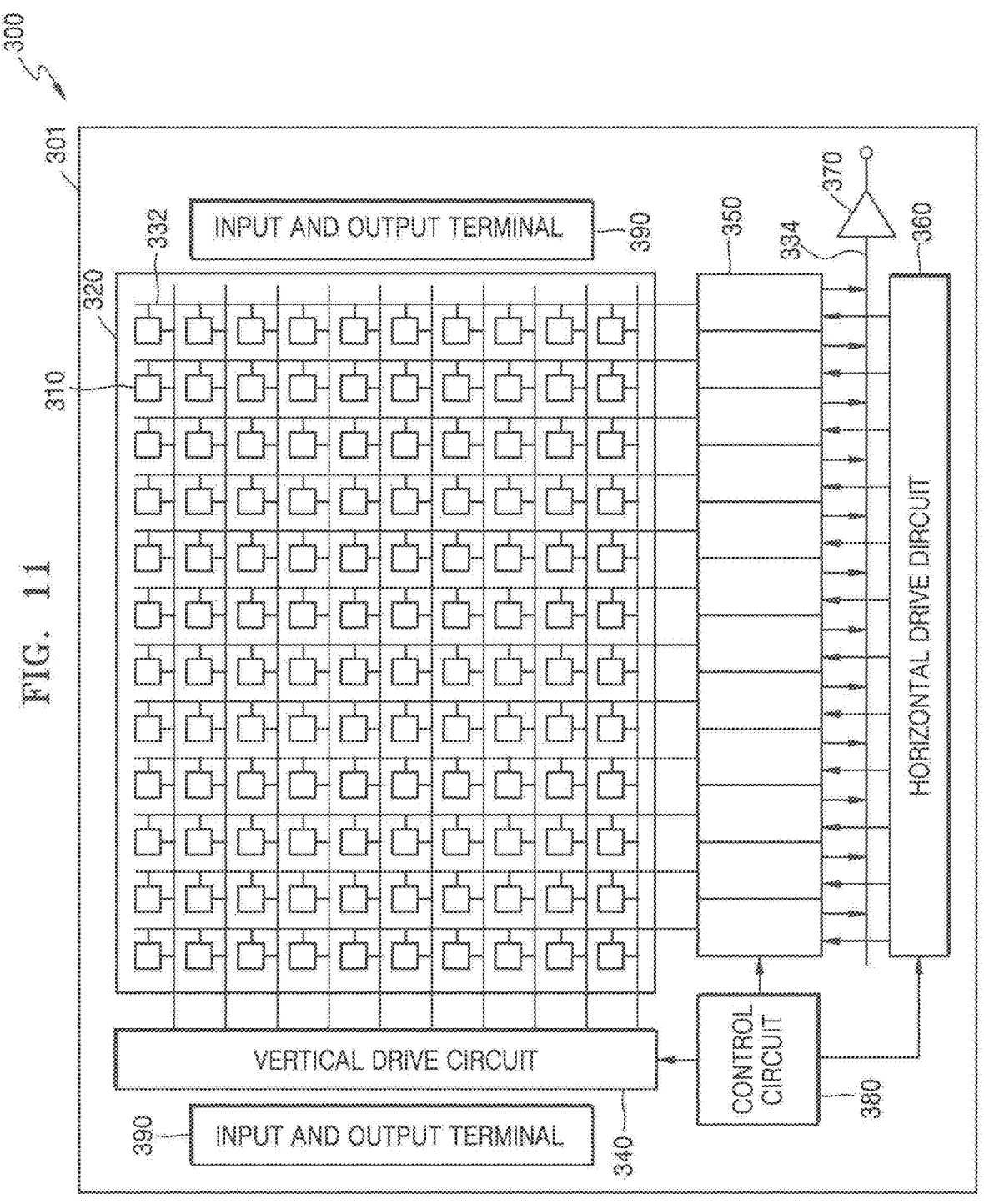
FIG. 11 is a schematic configuration diagram of an image sensor according to some example embodiments.

FIG. 11 is a schematic configuration diagram of an image sensor according to some example embodiments. FIGS. 1 to 10 are also referred to, and redundant descriptions that have been made with reference to FIGS. 1 to 10 are briefly given or omitted.

Referring to FIG. 11, an image sensor 300 may include a pixel unit 320 and a peripheral circuit unit. The pixel unit 320 may be formed by arranging a plurality of pixels 310, which each include a photodiode, in a 2D array structure in a substrate 301. The pixels 310 may include the pixel PX, PXa, or PXb included in at least one of the respective image sensors 100, 100a, and/or 100b of FIGS. 2, 5, and 6.

The peripheral circuit unit may be around the pixel unit 320 and include a vertical drive circuit 340, a column signal processing circuit 350, a horizontal drive circuit 360, an output circuit 370, and a control circuit 380.

The control circuit 380 may control the vertical drive circuit 340, the column signal processing circuit 350, the horizontal drive circuit 360, and the like. For example, based on a vertical synchronization signal, a horizontal synchronization signal, and a master clock, the control circuit 380 may generate a clock signal or control signals, based on which the vertical drive circuit 340, the column signal processing circuit 350, the horizontal drive circuit 360, and the like operate. The control circuit 380 may input the clock signal or the control signals to the vertical drive circuit 340, the column signal processing circuit 350, the horizontal drive circuit 360, and the like.

For example, the vertical drive circuit 340 may include a shift register. The vertical drive circuit 340 may select a pixel drive wiring and provide the selected pixel drive wiring with a pulse for driving a pixel, thereby driving the pixel in units of rows. For example, the vertical drive circuit 340 may selectively scan pulses sequentially in a vertical direction to pixels 310 of the pixel unit 320 in units of rows. In addition, the vertical drive circuit 340 may control a pixel signal, which corresponds to charges generated in a photoelectric conversion element, e.g., a photodiode, of each pixel 310, to be provided to the column signal processing circuit 350 through a vertical signal line 332.

The column signal processing circuit 350 may be provided for each column of pixels 310 and may perform signal processing, such as noise removal, on a signal, which is output from a row of pixels 310, with respect to each pixel column. For example, the column signal processing circuit 350 may perform signal processing, such as correlated double sampling (CDS), signal amplification, or analog-to-digital conversion, to remove noise inherent in the pixels 310. A horizontal select switch (not shown) may be provided at an output end of the column signal processing circuit 350.

For example, the horizontal drive circuit 360 may include a shift register. The horizontal drive circuit 360 may sequentially select column signal processing circuits 350 by sequentially outputting horizontal scan pulses such that each of the column signal processing circuit 350 outputs a pixel signal to a horizontal signal line 334.

The output circuit 370 may process signals, which are sequentially received from the column signal processing circuits 350 through the horizontal signal line 334, and output processed signals. For example, the output circuit 370 may perform only buffering or perform black level adjustment, column variation correction, and various kinds of digital signal processing. An input and output terminal 390 may exchange signals with the outside.

As described herein, any devices, electronic devices, modules, units, and/or portions thereof according to any of the example embodiments, and/or any portions thereof (including, without limitation, the image sensor 100, the image sensor 100a, the image sensor 100b, the active pixel region APR, the peripheral circuit region PCR, the pad region PDR, the electronic system 1000, the camera module group 1100, the camera modules 1100a, 1100b, 1100c, the application processor 1200, the image processing unit 1210, the image generator 1214, the sub processors 1212a, 1212b, 1212c, the camera module controller 1216, the memory controller 1220, the PMIC 1300, the external memory 1400, the internal memory 1230, the actuator 1130, the image sensing device 1140, the control logic 1144, the image sensor 1142, the memory 1146, the calibration data 1147, the storage 1150, the OPFE 1110, the image sensor 300, the substrate 301, the plurality of pixels 310, the pixel unit 320, the vertical signal line 332, the horizontal signal line 334, the vertical drive circuit 340, the column signal processing circuit 350, the horizontal drive circuit 360, the output circuit 370, the control circuit 380, the input and output terminal 390, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Any of the memories described herein, including, without limitation, the internal memory 1230, the external memory 1400, the memory 1146, and/or the storage 1150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

While the inventive concepts have been particularly shown and described with reference to some example embodiments thereof, it will be understood that various changes in form and details may be made therein without departing from the spirit and scope of the following claims.

What is claimed is:

1. An image sensor, comprising:
a substrate including a plurality of pixels, each pixel of the plurality of pixels including a separate photoelectric conversion region in an interior of the substrate;
a pixel isolation structure isolating the plurality of pixels; and
an isolation layer defining a plurality of active regions in the substrate,
wherein the plurality of active regions include
a center part having a plurality of branching sections extending from a center toward the plurality of pixels, the center being adjacent to each of the plurality of pixels, and
an extension part in the plurality of pixels and extending in a horizontal direction from the center part, and
wherein, in a plan view,
a first angle between a side wall of the extension part and the pixel isolation structure extending in a first direction exceeds about 45 degrees, or a second angle between two adjacent branching sections among the plurality of branching sections is less than about 90 degrees.

2. The image sensor of claim 1, wherein
the first angle is greater than about 45 degrees and less than or equal to about 90 degrees, or
the second angle is greater than or equal to about 45 degrees and less than about 90 degrees.

3. The image sensor of claim 1, wherein, in the plan view, an extension direction of a side wall of the center part is different from an extension direction of the side wall of the extension part.

4. The image sensor of claim 1, wherein an angle between two adjacent branching sections among the plurality of branching sections having the center part in common is constant.

5. The image sensor of claim 1, wherein, in the plan view, the center part has four branching sections.

6. The image sensor of claim 1, wherein
the plurality of active regions further include a first active region and a second active region,
the first active region includes the center part and the extension part, and
the second active region is in at least one pixel selected from the plurality of pixels, the second active region is separated from the first active region in the horizontal direction, and the second active region has a different planar shape than the first active region.

7. The image sensor of claim 1, wherein
the first angle is greater than or equal to about 60 degrees and less than or equal to about 70 degrees, and
the second angle is greater than or equal to about 80 degrees and less than about 90 degrees.

8. An image sensor, comprising:
a substrate including a plurality of pixels, a first surface, and a second surface opposite to the first surface, each pixel of the plurality of pixels including a separate photoelectric conversion region in an interior of the substrate;
an interlayer insulating layer on the first surface of the substrate;
a wiring structure on the interlayer insulating layer;
a pixel isolation structure isolating the plurality of pixels;
an isolation layer defining a plurality of active regions in the substrate; and
a plurality of transfer gates on the first surface of the substrate, the plurality of transfer gates passing through the interlayer insulating layer and at least a portion of the substrate in a vertical direction,
wherein each pixel of the plurality of pixels has a corner extending in both a first horizontal direction and a second horizontal direction that is perpendicular to the first horizontal direction, and
wherein, in a plan view,
a first angle between a first edge of each transfer gate of the plurality of transfer gates respectively overlapping with the plurality of active regions in the vertical direction and the pixel isolation structure extending in the first horizontal direction exceeds about 45 degrees, or
a second angle between a plurality of second edges of each transfer gate of the plurality of transfer gates separated from the plurality of active regions in a horizontal direction is greater than or equal to 90 degrees.

9. The image sensor of claim 8, wherein
the first angle is greater than about 45 degrees and less
than or equal to about 90 degrees, or
the second angle is greater than or equal to about 90
degrees and less than or equal to about 180 degrees.

10. The image sensor of claim 8, wherein at least one of
the plurality of second edges of each of the plurality of
transfer gates separated from the plurality of active regions
in the horizontal direction is not parallel with each of the first
horizontal direction and the second horizontal direction.

11. The image sensor of claim 8, wherein the plurality of
active regions include:
a center part having a plurality of branching sections
extending from a center toward the plurality of pixels,
the center being adjacent to each of the plurality of
pixels; and
an extension part in the plurality of pixels and extending
in the horizontal direction from the center part, and
in the plan view, the plurality of second edges of each of
the plurality of transfer gates separated from the plu-
rality of active regions in the horizontal direction have
a different extension direction than a side wall of the
center part.

12. The image sensor of claim 8, wherein
the first angle is greater than or equal to about 65 degrees
and less than or equal to about 75 degrees, and
the second angle is greater than or equal to about 90
degrees and less than or equal to about 100 degrees.

13. An image sensor, comprising:
a substrate including a plurality of pixels, a first surface,
and a second surface opposite to the first surface, each
pixel of the plurality of pixels including a separate
photoelectric conversion region in an interior of the
substrate;
an interlayer insulating layer on the first surface of the
substrate;
a wiring structure on the interlayer insulating layer;
a pixel isolation structure isolating the plurality of pixels;
an isolation layer defining a plurality of active regions in
the substrate; and
a plurality of transfer gates on the first surface of the
substrate, the plurality of transfer gates passing through
the interlayer insulating layer and at least a portion of
the substrate in a vertical direction,
wherein the plurality of active regions include
a center part having a plurality of branching sections
extending from a center toward the plurality of
pixels, the center being adjacent to each of the
plurality of pixels, and
an extension part in the plurality of pixels and extend-
ing in a horizontal direction from the center part, and
wherein, in a plan view,
a first angle between a side wall of the extension part
and the pixel isolation structure extending in a first
direction exceeds about 45 degrees, a second angle between two adjacent branching sec-
tions among the plurality of branching sections is
less than about 90 degrees,
a third angle between a first edge of each of the
plurality of transfer gates respectively overlapping
with the plurality of active regions in the vertical
direction and the pixel isolation structure extending
in the first direction exceeds about 45 degrees, and
a fourth angle between a plurality of second edges of
each of the plurality of transfer gates separated from
the plurality of active regions in the horizontal
direction is greater than or equal to about 90 degrees.

14. The image sensor of claim 13, wherein
the first angle is greater than about 45 degrees and less
than or equal to about 90 degrees,
the second angle is greater than or equal to about 45
degrees and less than about 90 degrees,
the third angle is greater than about 45 degrees and less
than or equal to about 90 degrees, or
the fourth angle is greater than or equal to about 90
degrees and less than or equal to about 180 degrees.

15. The image sensor of claim 13, wherein, in the plan
view, the plurality of second edges of each of the plurality
of transfer gates separated from the plurality of active
regions in the horizontal direction have a different extension
direction than a side wall of the center part.

16. The image sensor of claim 13, wherein, in the plan
view, each of the plurality of second edges of each of the
plurality of transfer gates separated from the plurality of
active regions in the horizontal direction extends in a
diagonal direction.

17. The image sensor of claim 13, wherein at least a
portion of the extension part overlaps with at least some of
the plurality of transfer gates in the vertical direction.

18. The image sensor of claim 13, wherein
the first angle is greater than or equal to about 60 degrees
and less than or equal to about 70 degrees,
the second angle is greater than or equal to about 80
degrees and less than about 90 degrees,
the third angle is greater than or equal to about 65 degrees
and less than or equal to about 75 degrees, and
the fourth angle is greater than or equal to about 90
degrees and less than or equal to about 100 degrees.

19. The image sensor of claim 13, wherein
the first angle is different from the third angle, or
the second angle is different from the fourth angle.

20. The image sensor of claim 13, wherein, in the plan
view, a horizontal area of an overlap between each of the
plurality of active regions and each of the plurality of
transfer gates in the vertical direction is at least about 0.05
$\mu m^2$.

* * * * *